US011303821B2

(12) United States Patent
Inazumi et al.

(10) Patent No.: US 11,303,821 B2
(45) Date of Patent: Apr. 12, 2022

(54) ILLUMINATION DEVICE, ILLUMINATION UNIT, AND IMAGE PROCESSING SYSTEM

(71) Applicant: OMRON Corporation, Kyoto (JP)

(72) Inventors: Shingo Inazumi, Kyoto (JP); Jaewook Hwang, Kyoto (JP); Yutaka Kato, Kyoto (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 16/248,800

(22) Filed: Jan. 16, 2019

(65) Prior Publication Data

US 2019/0289189 A1  Sep. 19, 2019

(30) Foreign Application Priority Data

Mar. 13, 2018 (JP) .............................. JP2018-045332

(51) Int. Cl.
| | | |
|---|---|---|
| *H04N 5/235* | (2006.01) | |
| *G06T 7/00* | (2017.01) | |
| *G06T 7/586* | (2017.01) | |
| *G01N 21/88* | (2006.01) | |
| *G03F 7/20* | (2006.01) | |

(52) U.S. Cl.
CPC ....... *H04N 5/2354* (2013.01); *G01N 21/8806* (2013.01); *G03F 7/20* (2013.01); *G03F 7/7065* (2013.01); *G06T 7/0004* (2013.01); *G06T 7/586* (2017.01); *G01N 2201/0245* (2013.01); *G06T 2207/10152* (2013.01); *G06T 2207/30164* (2013.01)

(58) Field of Classification Search
CPC .................. H04N 5/2354; G06T 7/586; G06T 2207/10152; G06T 2207/30164; G01N 21/8806; G01N 2201/0245; G03F 7/20; G03F 7/7065; G03F 7/0004
USPC ........................................................ 348/136
See application file for complete search history.

(56) References Cited

U.S. PATENT DOCUMENTS

| | | | | |
|---|---|---|---|---|
| 5,564,108 A | * | 10/1996 | Hunsaker ........... | A61B 5/14551 702/65 |
| 6,170,963 B1 | * | 1/2001 | Arnold ............... | G01N 21/8806 257/98 |

(Continued)

FOREIGN PATENT DOCUMENTS

| | | |
|---|---|---|
| CN | 103697422 | 4/2014 |
| CN | 105377115 | 3/2016 |

(Continued)

OTHER PUBLICATIONS

"Search Report of Europe Counterpart Application", dated Sep. 3, 2019, p. 1-p. 12.

(Continued)

*Primary Examiner* — Rebecca A Volentine
*Assistant Examiner* — Jimmy S Lee
(74) *Attorney, Agent, or Firm* — JCIPRNET

(57) ABSTRACT

An illumination device includes illumination units for irradiating light on an object and a substrate member, which is an example of a holding mechanism for detachably holding the illumination units according to a predetermined disposition rule. The substrate member has a connection part for electrically connecting with a controller. The substrate member holds a part of the illumination units by linking parts.

9 Claims, 14 Drawing Sheets

(56) References Cited

U.S. PATENT DOCUMENTS

| | | | |
|---|---|---|---|
| 2006/0091825 A1* | 5/2006 | Abramovich | G01N 21/8806 315/291 |
| 2007/0019186 A1* | 1/2007 | Sung et al. | G01N 21/95684 356/237.5 |
| 2008/0205060 A1* | 8/2008 | Chien | G01S 3/7864 362/249.07 |
| 2010/0118508 A1* | 5/2010 | Okada | H05K 13/0812 362/3 |
| 2012/0206050 A1 | 8/2012 | Spero | |
| 2013/0229802 A1 | 9/2013 | Fukushima et al. | |
| 2015/0009500 A1* | 1/2015 | Wong | G01R 35/005 356/402 |
| 2015/0355101 A1* | 12/2015 | Sun | G01N 21/8806 348/46 |
| 2016/0109377 A1 | 4/2016 | Chang et al. | |
| 2017/0089840 A1 | 3/2017 | Hashiguchi | |
| 2017/0212410 A1* | 7/2017 | Liu | H05B 45/44 |

FOREIGN PATENT DOCUMENTS

| | | |
|---|---|---|
| CN | 205806973 | 12/2016 |
| CN | 206268942 | 6/2017 |
| JP | H07152553 | 6/1995 |
| JP | H11295047 | 10/1999 |
| JP | 2005265741 | 9/2005 |
| JP | 2006194828 | 7/2006 |
| JP | 2006214859 | 8/2006 |
| JP | 2006313146 | 11/2006 |
| JP | 2007101309 | 4/2007 |
| JP | 2007299682 | 11/2007 |
| JP | 2009117228 | 5/2009 |
| JP | 2009289516 | 12/2009 |
| JP | 2015022834 | 2/2015 |
| JP | 2015031804 | 2/2015 |
| JP | 2015038808 | 2/2015 |
| JP | 2015232483 | 12/2015 |
| JP | 2018017638 | 2/2018 |
| WO | 2011096365 | 8/2011 |

OTHER PUBLICATIONS

Office Action of Japan Counterpart Application, with English translation thereof, dated Mar. 9, 2021, pp. 1-8.

Office Action of China Counterpart Application, with English translation thereof, dated Mar. 2, 2021, pp. 1-17.

"Office Action of China Counterpart Application", dated Jul. 14, 2021, with English translation thereof, p. 1-p. 20.

Office Action of Japan Counterpart Application, with English translation thereof, dated Oct. 19, 2021, pp. 1-6.

* cited by examiner

⟨Perspective view of the illumination device 4 when viewed from the bottom⟩

ILLUMINATION DEVICE, ILLUMINATION UNIT, AND IMAGE PROCESSING SYSTEM

CROSS-REFERENCE TO RELATED APPLICATION

This application claims the priority benefit of Japan Patent Application No. 2018-045332, filed on Mar. 13, 2018. The entirety of the above-mentioned patent application is hereby incorporated by reference herein and made a part of this specification.

BACKGROUND

Technical Field

The disclosure relates to an illumination device, an illumination unit, and an image processing system.

BACKGROUND

Description of Related Art

In the field of FA (Factory Automation), etc., an image processing technology for imaging an object (hereinafter also referred to as a "workpiece") under illumination by light from an illumination device and obtaining information regarding the workpiece from the generated image has been put to use.

A variety of illumination devices have been developed as illumination devices used in the field of image processing technology. For example, Japanese Patent Laid-open No. 2006-313146 (Patent Document 1) discloses an illumination device in which a plurality of red light sources, green light sources, and blue light sources are arranged in a ring shape with their optical axes oriented vertically.

Related Art

Patent Document

[Patent Document 1] Japanese Laid-open No. 2006-313146

The pattern of light irradiated from the illumination device is determined according to various factors such as the type of the object, the content of the image processing, and the relative positional relationship between the object, the camera, and the illumination device. In the illumination device disclosed in Patent Document 1, since each light source is fixed on the illumination device, even if there is an unused light source, the unused light source cannot be detached. As a result, even if there is an unused light source, the cost of this light source is spent. Also, since the light sources are fixed, the degree of freedom of the illumination device is low.

SUMMARY

According to an example of the disclosure, an illumination device for irradiating light on an object in image measurement which performs an appearance inspection of the object is provided. The illumination device includes: illumination units for irradiating light on the object; a holding mechanism for detachably holding the illumination units according to a predetermined disposition rule; and a connection part for electrically connecting with a controller which performs a lighting control of the illumination units held by the holding mechanism.

According to another example of the disclosure, an illumination unit included in an illumination device for irradiating light on an object in image measurement which performs an appearance inspection of the object is provided. The illumination unit includes: a holding mechanism to be detachably held at a predetermined position of the illumination device; and a connection part for electrically connecting with a controller which performs a lighting control of the illumination device.

According to still another example of the disclosure, an image processing system for performing image measurement with use of an appearance image of an object is provided. The image processing system includes: an imaging part for imaging the object and generating the appearance image; an illumination device for irradiating light on the object; and a controller for controlling the illumination device and the imaging part. The illumination device includes: illumination units for irradiating light on the object; a holding mechanism for detachably holding the illumination units according to a predetermined disposition rule; and a connection part for electrically connecting with the controller.

DESCRIPTION OF THE EMBODIMENTS

Figure 1:
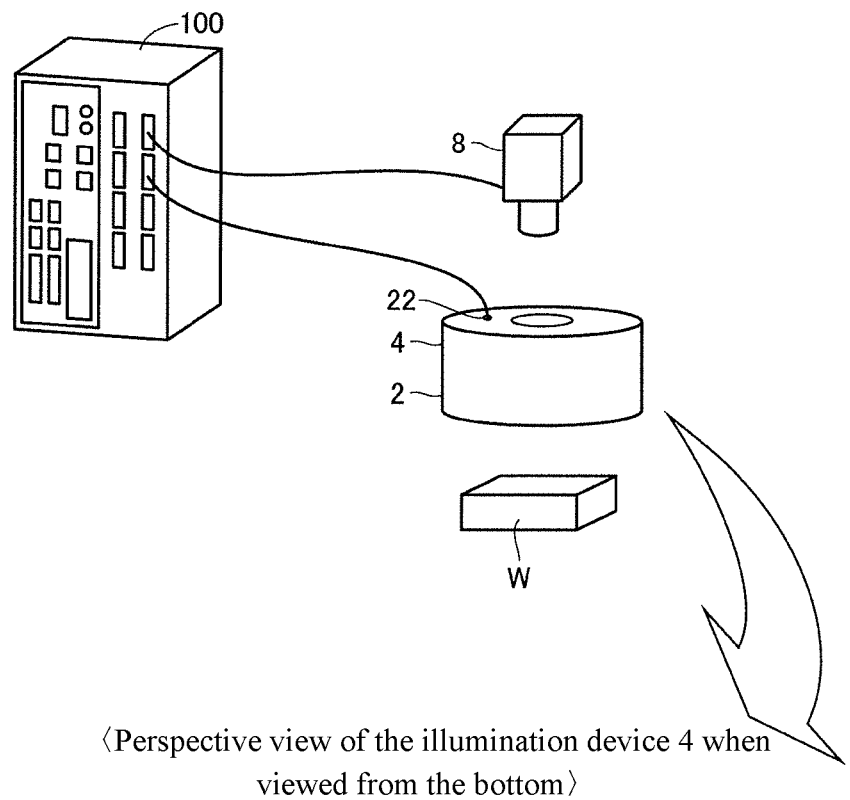
FIG. 1 is a diagram showing a configuration example of the image processing system.
Figure 1:
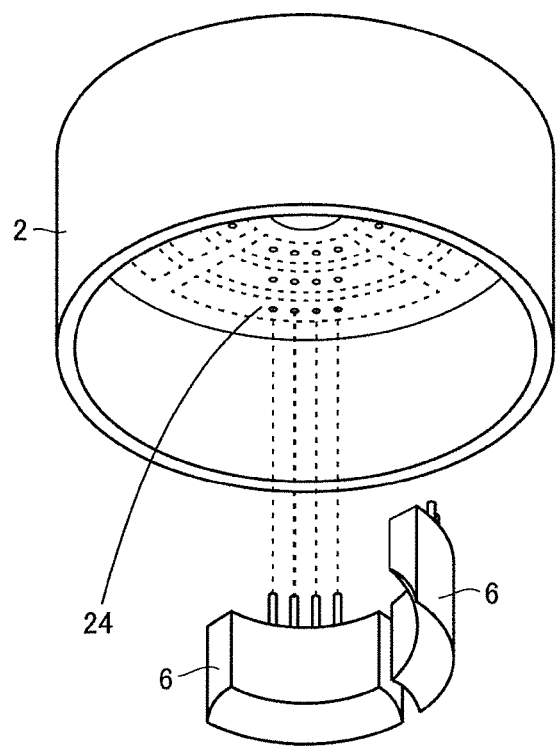

As described above, the disclosure provides an illumination device with a high degree of freedom in design, an illumination unit for increasing the degree of freedom of the illumination device, and an image processing system including an illumination device with a high degree of freedom in design.

According to the disclosure, the illumination units are detachably attached, which can therefore increase the degree of freedom in the illumination design. Further, it is sufficient to prepare only the illumination units necessary for realizing irradiation patterns to be irradiated, and the cost can be reduced.

In the above disclosure, the holding mechanism may include a substrate member provided with a plurality of linking parts detachably linked to end parts of the illumination units according to the predetermined disposition rule, and the end parts are provided at positions different from light emitting surfaces of the illumination units.

According to the disclosure, since the locations for attaching the illumination units are designed in advance, the attachment is easy.

In the above disclosure, the connection part may be formed integrally with the substrate member. Further, the lighting control of the illumination unit may be performed by the controller by connecting the end part of the illumination unit to one linking part among the plurality of linking parts.

According to the disclosure, the electrical connection and the mechanical connection can be integrated, and the structure can be simplified, and the design of the illumination device becomes easy.

In the above disclosure, the holding mechanism may be formed integrally with the illumination units and may link the plurality of illumination units to one another according to the predetermined disposition rule.

According to the disclosure, since the substrate member is not necessary, the shape of the entire illumination device can be made smaller.

In the above disclosure, the illumination units may include: first illumination units whose dominant wavelength to be irradiated is a first wavelength; and second illumination units whose dominant wavelength to be irradiated is a second wavelength different from the first wavelength.

According to the disclosure, the illumination device having different dominant wavelengths of the irradiated light can be created through combinations of the illumination units, and the versatility of the illumination device is increased.

In the above disclosure, the illumination units may include identification mechanisms for identifying which illumination units among the first illumination units and the second illumination units are held.

According to the disclosure, since the types of the illumination units can be determined, it can be specified which types of the illumination units have been attached or are to be attached, and the usability is increased.

In the above disclosure, the illumination units may include: illumination units having housings in a first shape; and illumination units having housings in a second shape different from the first shape.

According to the disclosure, the variation of the irradiation patterns at the time of irradiation can be increased, and the versatility of the illumination device is increased.

According to the disclosure, the degree of freedom of the illumination device can be increased.

According to the disclosure, the image processing system including the illumination device with a high degree of freedom in design can be provided.

The disclosure can provide the illumination device with a high degree of freedom in design, the illumination unit for increasing the degree of freedom of the illumination device, and the image processing system including the illumination device with a high degree of freedom in design.

The above and other objects, features, aspects and advantages of the disclosure will become apparent from the following detailed description related to the disclosure, which will be understood in conjunction with the accompanying drawings.

§ 1 Applicable Example

An applicable example of the disclosure will be described with reference to FIG. 1. FIG. 1 is a diagram showing a configuration example of an image processing system 1. The image processing system 1 is a system for performing image measurement with use of an appearance image of an object W. The image processing system 1 includes a camera 8, which is an example of an imaging part for imaging the object W; an illumination device 4, which is an example of an illumination device for irradiating light on the object W; and a controller 100 for controlling the camera 8 and the illumination device 4.

In addition, FIG. 1 also shows a perspective view of the illumination device 4 when viewed from the bottom. The illumination device 4 includes illumination units 6 for irradiating light on the object W and a substrate member 2, which is an example of a holding mechanism for detachably holding the illumination units 6 according to a predetermined disposition rule. The substrate member 2 has a connection part 22, which is an example of a connection part for electrically connecting with the controller. In the example shown in FIG. 1, the substrate member 2 holds a part of the illumination units 6 by linking parts 24 of the substrate member 2.

Here, the "predetermined disposition rule" does not mean that the illumination units 6 can be attached as desired but means that in a case where the illumination units 6 are attached to the substrate member 2, the positions where the illumination units 6 are attached are predetermined, and the "predetermined disposition rule" is not limited to a case where the disposition locations are regular.

Further, the method of holding the illumination units 6 by the substrate member 2 is not limited to the method shown in FIG. 1, and the illumination units 6 may be held in any method as long as the illumination units 6 are configured to be attached mechanically.

Further, although FIG. 1 shows an example in which the illumination units 6 are held by being attached to the substrate member 2, the illumination units 6 may be configured to hold one another by being linked to one another. Even in such a case, the "predetermined disposition rule" does not mean that the relative positional relationship among the illumination units 6 can be set as desired but means that the positional relationship is limited to a certain extent, and the "predetermined disposition rule" is not limited to a case where the linking order is predetermined.

In this way, the illumination device 4 shown in FIG. 1 can attach the illumination units 6 according to the predetermined disposition rule. Therefore, it is sufficient to prepare only the illumination units 6 necessary for realizing irradiation patterns to be irradiated, and the cost can be reduced. Further, the illumination units 6 are detachably attached, which can therefore increase the degree of freedom in illumination design.

§ 2 Specific Example

<A. Configuration of Image Processing System>

Figure 2:
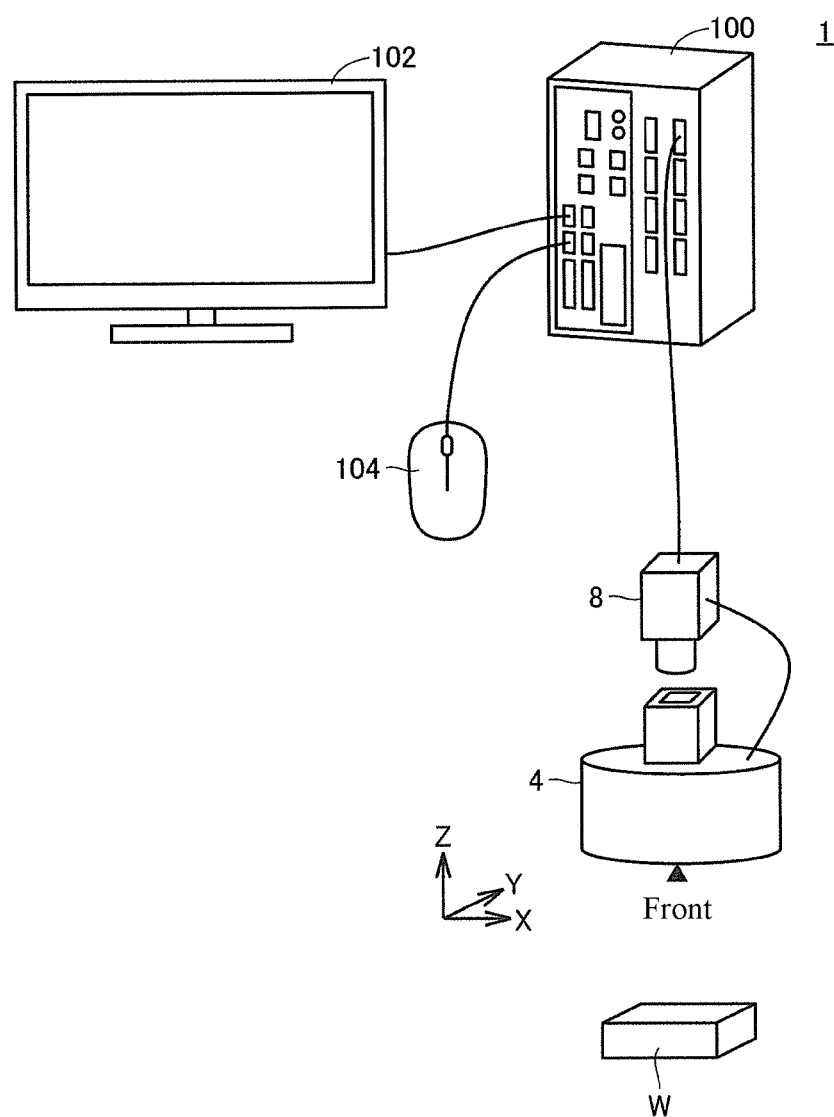
FIG. 2 is a schematic diagram showing a basic configuration of the image processing system.

FIG. 2 is a schematic diagram showing a basic configuration of the image processing system 1. The image processing system 1 includes the controller 100, the camera 8, and the illumination device 4 as main components. The controller 100 and the camera 8 are connected to each other in a way that allows data communication. The illumination device 4 is controlled by the controller 100 via the camera 8. It is not necessarily configured that the illumination device 4 is controlled by the controller 100 via the camera 8, and the illumination device 4 may be directly controlled by the controller 100.

In the following, for ease of description, the direction in which light is irradiated from the illumination device 4 is defined as the Z axis, and the horizontal direction on the paper is defined as the X axis, and the axis perpendicular to the X axis and the Z axis is defined as the Y axis. Further, the side where light is irradiated is defined as the lower side.

The camera 8 is an imaging part for imaging a subject which exists in an imaging visual field and for generating an image. The camera 8 includes an optical system such as a lens, an aperture, etc. and a light receiving element such as a CCD (Charge Coupled Device) image sensor, a CMOS (Complementary Metal Oxide Semiconductor) image sensor, etc. as main components.

The controller 100 can inspect the presence or absence of defects and uncleanness on the object W; measure the size, disposition, orientation, etc. of the object W; and perform image processing such as recognition of characters and figures attached on the surface of the object W; and, in addition, can receive settings of contents of the image processing. The settings of the contents of the image processing include settings of imaging conditions at the time of obtaining the image and settings of processing contents to be executed on the image. The settings of the imaging conditions include a lighting setting for the illumination device 4 and a camera setting for the camera 8. The controller 100 functions as a device for setting the lighting setting for the illumination device 4. Further, a setting support device for setting the lighting setting for the illumination device 4 may be provided in addition to the controller 100.

The controller 100 is electrically connected to a display part 102 and a mouse 104 which functions as an input part for inputting information related to various settings. The display part 102 is typically composed of, for example, a liquid crystal display to display setting contents to a user. For example, the user can input setting information related to the settings of the contents of the image processing and can set various settings by operating the mouse 104 based on the information displayed on the display part 102. Although the input part has been configured by the mouse 104, the input part may be configured by a keyboard or a touch panel or a combination thereof. Further, although the example in which the controller 100, the display part 102, and the mouse 104 are separately formed has been described, at least a part of them may be integrally formed.

<B. Configuration of Illumination Device>

Figure 3:
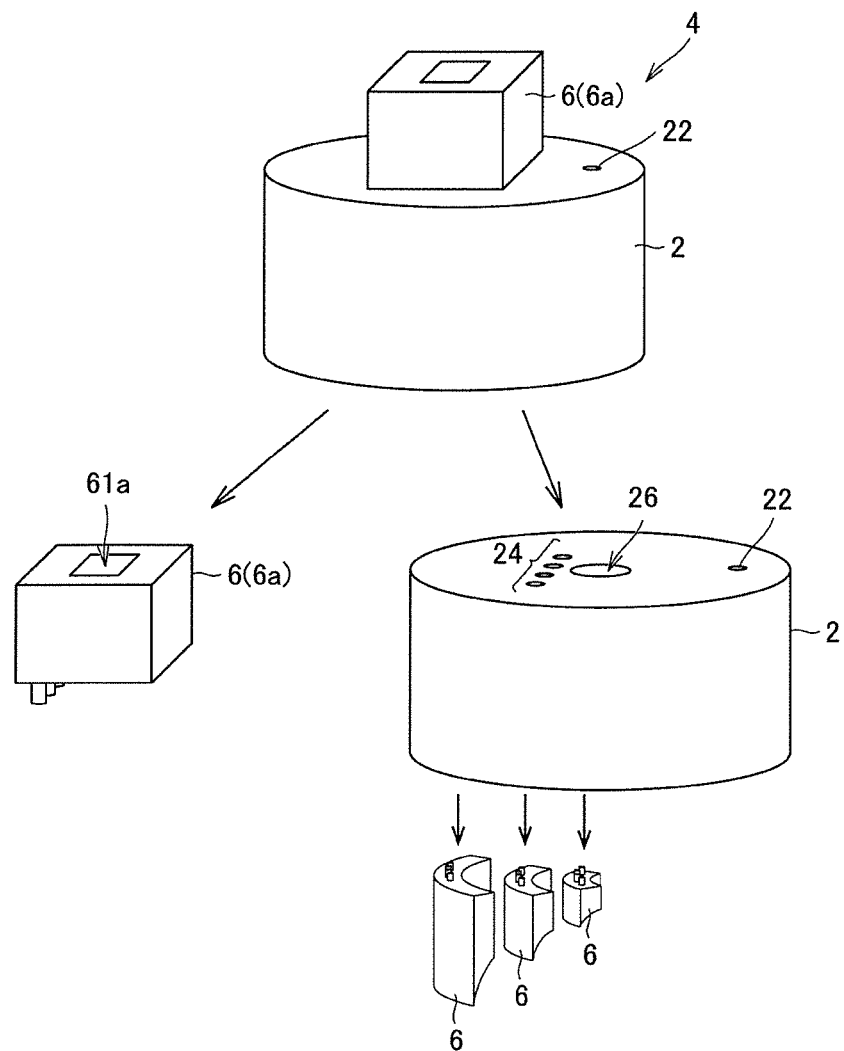
FIG. 3 is a diagram for explaining a configuration of the illumination device.

A configuration of the illumination device 4 will be described with reference to FIGS. 3 to 6C. FIG. 3 is a diagram for explaining the configuration of the illumination device 4.

The illumination device 4 includes a plurality of illumination units 6, the holding mechanism for holding the illumination units 6, and the substrate member 2 having the connection part 22 for electrically connecting with the controller 100. In the example shown in FIG. 3, although the illumination device 4 including the plurality of illumination units 6 has been taken as an example, the illumination device 4 functions if at least one illumination unit 6 is attached to the substrate member 2.

Figure 4:
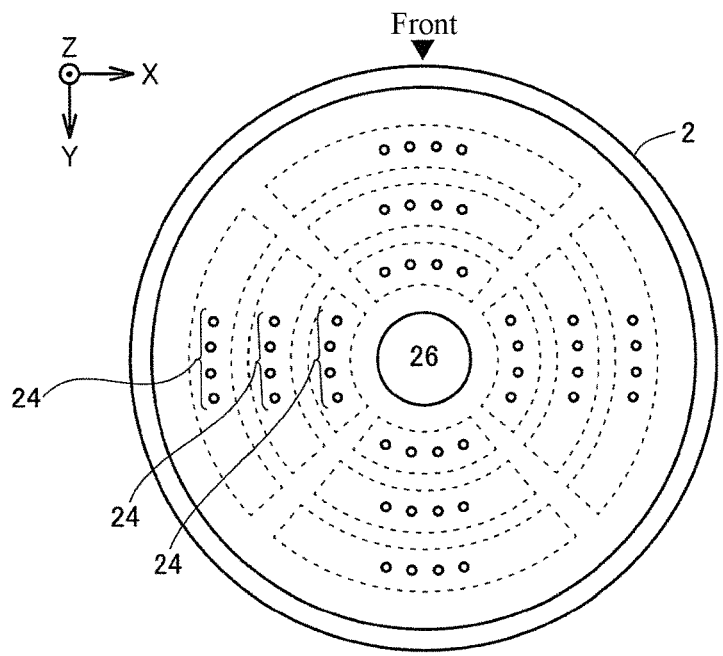
FIG. 4 is a bottom view of the substrate member.

The illumination units 6 are detachably held by the holding mechanism of the substrate member 2 according to the predetermined disposition rule. FIG. 4 is a bottom view of the substrate member 2. As shown in FIG. 4, the substrate member 2 includes a plurality of linking parts 24 for mechanically linking with the illumination units 6. The plurality of linking parts 24 are provided on the substrate member 2 according to the predetermined disposition rule. Here, the plurality of linking parts 24 are not necessarily disposed side by side with regularity, and it is sufficient that they are disposed so that the illumination units 6 can be attached to each of the linking parts 24 disposed at adjacent positions.

In the present embodiment, as shown in FIG. 4, each circumference of a plurality of concentric circles having different diameters on a lower surface side of the substrate member 2 is provided with four linking parts 24, and, as shown in FIG. 3, an upper surface side of the substrate member 2 is provided with one linking part 24. Further, an opening part 26 is provided in the center of the substrate member 2 so that the camera 8 can image the object W from above the illumination device 4. In addition, some reference numerals are omitted in FIG. 4. Further, each of the linking parts 24 is configured by a plurality of holes and holds the illumination unit 6 with each of the holes inserted with pins provided on the illumination unit 6.

Figure 5:
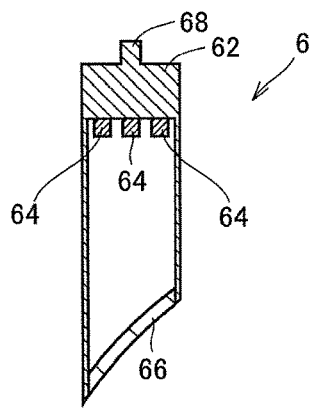
FIG. 5 is a schematic diagram of a cross-sectional view of the illumination unit.

FIG. 5 is a schematic diagram of a cross-sectional view of the illumination unit 6. In FIG. 5, the illumination unit 6 connected to the lower surface side of the substrate member 2 will be described as an example. The illumination unit 6 includes a housing 62, a plurality of light sources 64, and a diffusion plate 66.

It is sufficient to provide at least one light source 64, and the light sources 64 are installed on the housing 62. The light sources 64 irradiate light with power supplied from the controller 100 via the connection part 22 of the substrate member 2.

The light irradiated from the light sources 64 is irradiated via the diffusion plate 66. Therefore, the diffusion plate 66 functions as a light emitting surface. Here, the light emitting surface is a surface located at the boundary between the illumination unit 6 and the outside when the light from the light sources 64 is irradiated to the outside of the illumination unit 6 and is not necessarily defined by a physical substance such as the diffusion plate 66.

A connection part 68, which functions as an end part detachably connected to the linking part 24 of the substrate member 2, is provided on the housing 62 at a position different from the light emitting surface. The connection part 68 is configured to be inserted into the linking part 24 of the substrate member 2 and engaged with the linking part 24, and the connection part 68 and the linking part 24 are mechanically connected. Further, in the present embodiment, the connection part 68 and the linking part 24 also have a function of electrically connecting the substrate member 2 and the illumination unit 6. Since the substrate member 2 and the controller 100 are electrically connected by the connection part 22 of the substrate member 2, the illumination unit 6 can be electrically connected to the controller 100 by the connection part 68, the linking part 24 and also the connection part 22 of the substrate member 2 and can supply power from the controller 100 to the light sources 64. Here, the connection part 68 is typically a spring pin, for example.

Figures 6A, 6B, 6C:
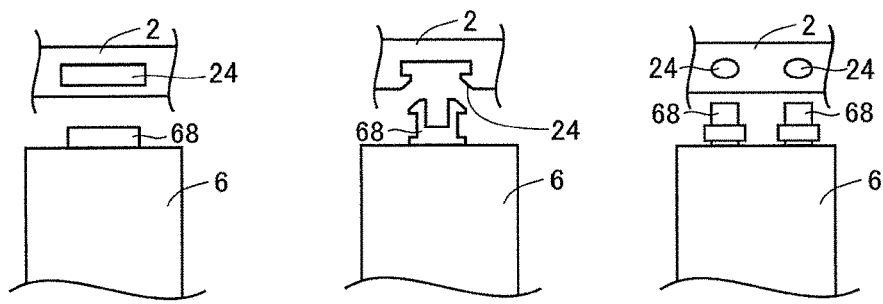
FIGS. 6A to 6C are diagrams showing other forms of the connection part of the illumination unit and of the linking part of the substrate member.

FIGS. 6A to 6C are diagrams showing other forms of the connection part 68 of the illumination unit 6 and of the linking part 24 of the substrate member 2. In the example shown in FIGS. 3 to 5, the connection part 68 is configured by a plurality of elongated pins, that is, configured by so-called spring pins, but other configurations may be adopted. In FIGS. 6A to 6C, only connection modes are enlarged and shown. For example, the connection mode may be configured by a Board-to-board (B-to-B) connector for connecting substrates to each other, as shown in FIG. 6A. Further, although the connection part 68 and the linking part 24 have the function of mechanically connecting the substrate member 2 and the illumination unit 6 and the function of electrically connecting the substrate member 2 and the illumination unit 6, the two functions may be realized by different connection mechanisms. For example, in addition to using the connection mechanism formed by the spring pins and the B-to-B connector shown in FIGS. 5 and 6A for electrical connection, a snap-fit type connection mechanism shown in FIG. 6B or a screw type connection mechanism shown in FIG. 6C may also be used for mechanical connection. Further, the mechanical connection may use both the snap-fit type connection mechanism and the screw type connection mechanism.

By realizing the mechanical connection and the electrical connection with different connection mechanisms, the illumination unit 6 can be stably fixed to the substrate member 2. On the other hand, by realizing the mechanical connection and the electrical connection with one connection mechanism, a simple structure is made possible, and as a result, the burden required for connection can be reduced.

In FIG. 5, the illumination unit 6 connected to the lower surface side of the substrate member 2 has been described as an example, but an illumination unit 6a functioning as coaxial incident illumination as shown in FIG. 3 may be provided above the opening part 26 of the substrate member 2. The illumination unit 6a, when installed on the substrate member 2, includes on its upper surface an opening part 61a which allows the camera 8 to image the object from above the illumination device 4. The illumination unit 6a is installed on the upper surface of the substrate member 2 so that the opening part 61a of the illumination unit 6a is disposed at a position facing the opening part 26 of the substrate member 2.

That is, in the present embodiment, the illumination units 6 are detachably held on the substrate member 2 by the holding mechanism configured by the connection parts 68 and the linking parts 24. The illumination units 6 can be detachably connected to positions where the linking parts 24 are provided. As a result, it is sufficient to prepare only the illumination units 6 necessary for realizing irradiation patterns to be irradiated, and the cost can be reduced. Further, since the illumination units 6 can be held by the holding mechanism according to the predetermined disposition rule, the number and disposition of the illumination units 6 can be adjusted, and as a result, the illumination device with a high degree of freedom can be provided.

<C. Types of Illumination Units 6>

Figure 7:
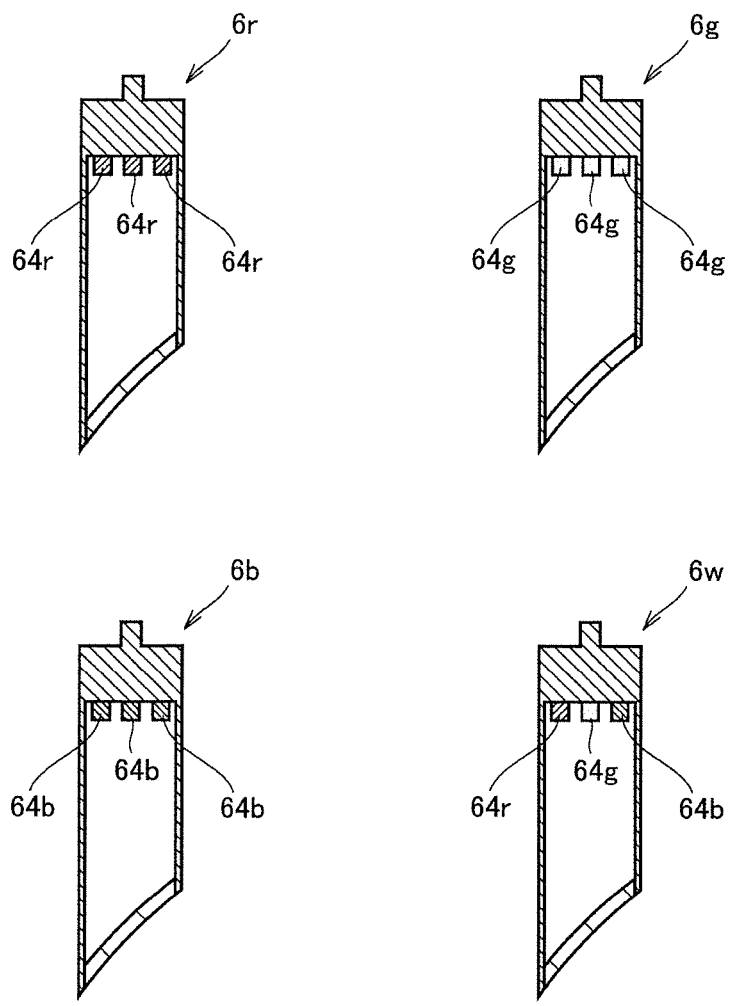
FIG. 7 is a diagram showing a plurality types of the illumination units classified according to the irradiated light.

The illumination units 6 can be classified according to differences in the dominant wavelength of light irradiated from the illumination units 6, that is, colors of the irradiated light. FIG. 7 is a diagram showing a plurality types of the illumination units 6 classified according to the irradiated light. FIG. 7 shows schematic diagrams of cross-sectional views of the illumination units 6. The illumination units 6 can be classified into red illumination units 6r for irradiating red light, green illumination units 6g for irradiating green light, blue illumination units 6b for irradiating blue light, and white illumination units 6w for irradiating white light.

The red illumination units 6r include only red light sources 64r. The green illumination units 6g include only green light sources 64g. The blue illumination units 6b include only blue light sources 64b. The white illumination units 6w may have the red light sources 64r, the green light sources 64g and the blue light sources 64b, or may have white light sources. Further, it is sufficient that various types of the illumination units 6 have the colors of the irradiated light different from one another; the colors of the irradiated light may be changed by, for example, providing a color filter on the diffusion plate 66.

Further, the illumination units 6 can also be classified according to differences in optical design. For example, the illumination units 6 can be classified into the illumination unit 6a (with reference to FIG. 3) which functions as the coaxial incident illumination and the illumination units 6 which do not change the direction of light irradiated from the light sources 64.

Further, the illumination units 6 can also be classified according to differences in the shape of the housing 62. For example, the illumination units 6 can be classified into three types according to the shape of the upper surface which is a bonding surface with the substrate member 2. Also, the three types of the illumination units 6 having different shapes of the upper surfaces have different heights and different shapes of the diffusion plates 66, which are the shapes of the lower surfaces, from one another. Specifically, among the three concentric circles having different diameters and provided on the substrate member 2, the shape of the upper surfaces of the illumination units 6 connected to the linking parts 24 disposed on the circumference of the circle having the largest diameter, the shape of the upper surfaces of the illumination units 6 connected to the linking parts 24 disposed on the circumference of the circle having the medium-sized diameter, and the shape of the upper surfaces of the illumination units 6 connected to the linking parts 24 disposed on the circumference of the circle having the smallest diameter are different from one another.

Figure 8:
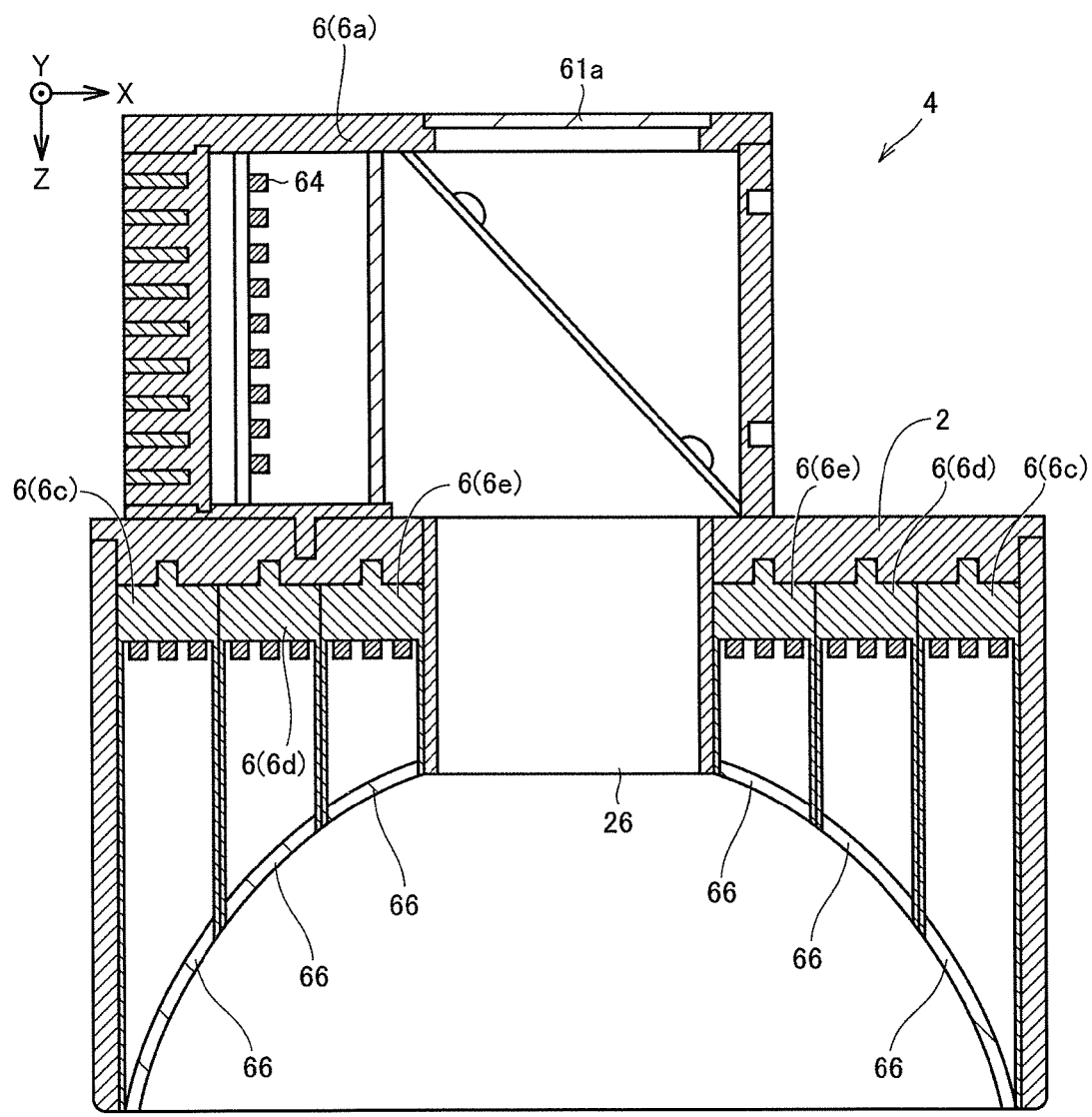
FIG. 8 is an XZ sectional view of the illumination device.

FIG. 8 is an XZ sectional view of the illumination device 4. In the illumination device 4 shown in FIG. 8, the illumination units 6 are provided on all of the plurality of linking parts 24 provided on the substrate member 2. As shown in FIG. 8, in a case where the three types of the illumination units 6 (6c, 6d and 6e) having different shapes of the upper surfaces and with the respective heights and shapes of the lower surfaces (the diffusion plates 66) are attached to the corresponding linking parts 24, it is configured that a surface formed by a plurality of diffusion plates 66 forms a dome shape.

<D. Mechanism for Specifying Types of Illumination Units 6>

The illumination units 6 are classified into a plurality of types according to the differences in the dominant wavelength of the irradiated light, the differences in the optical design, the differences in the shape of the housing 62, etc. For this reason, there is a concern that the user may not know among the attached illumination units 6, which type of the illumination unit 6 among the plurality types of the illumination units 6 is attached to each of the plurality of linking parts 24. In order to solve such a problem, each of the illumination units 6 includes an identification mechanism for specifying the type of the illumination unit 6.

Figure 9:
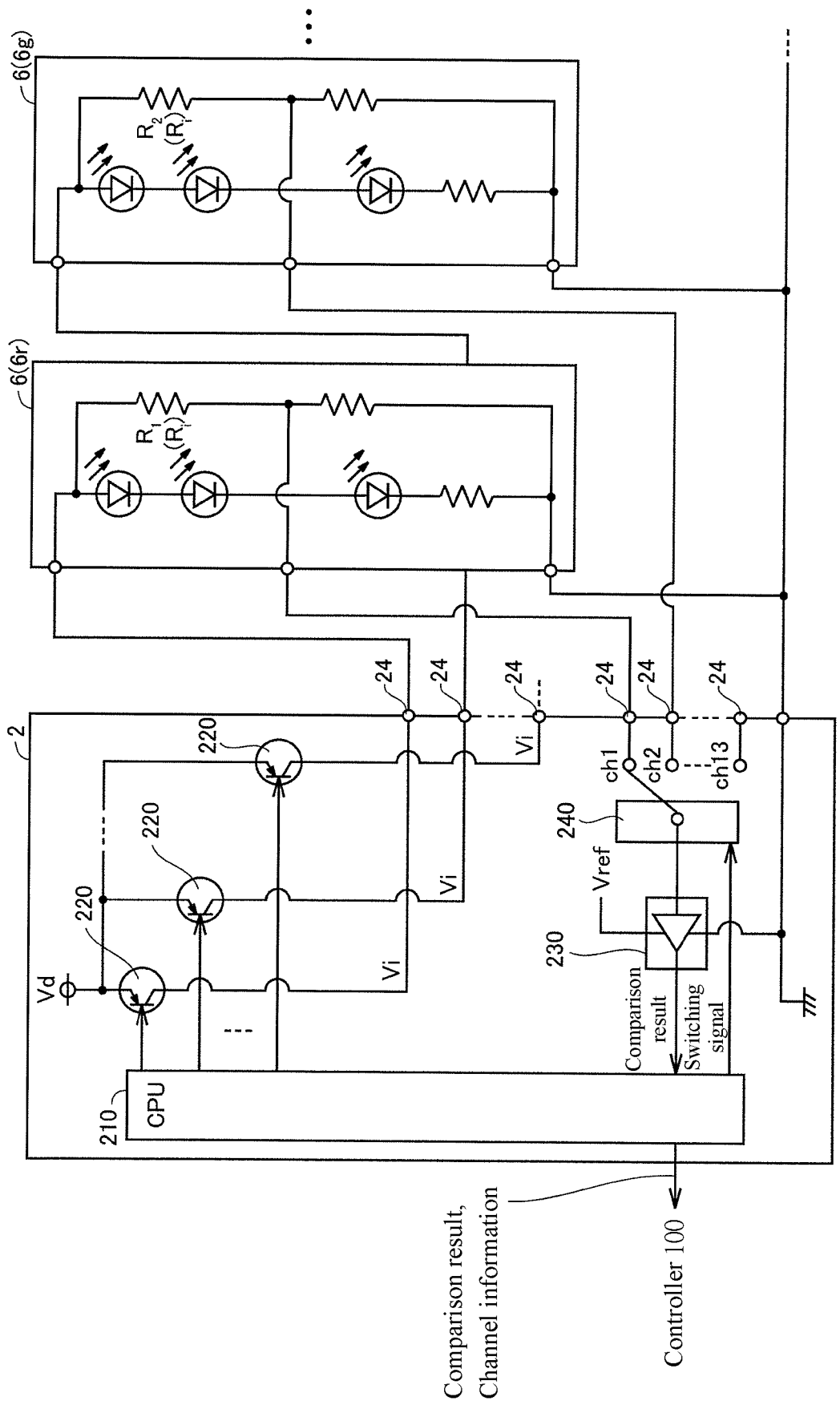
FIG. 9 is a diagram showing a schematic configuration of the substrate member and the illumination units for specifying the types of the illumination units.

FIG. 9 is a diagram showing a schematic configuration of the substrate member 2 and the illumination units 6 for specifying the types of the illumination units 6. The substrate member 2 includes a CPU 210 for performing a lighting control of the light sources 64 included in the illumination units 6 attached to the illumination device 4 according to a command from the controller 100, transistors 220 for passing currents to the attached illumination units 6, and a comparator 230 functioning as a specifying part for specifying the types of the illumination units 6.

A current sent from a power supply voltage Vd is sent to each of the transistors 220 provided corresponding to each of the plurality of linking parts 24. Each of the transistors 220 corrects the current sent from the power supply voltage Vd according to a signal sent from the CPU 210 and supplies a current Vi to the illumination unit 6 held at the corresponding linking part 24.

One input terminal of the comparator 230 receives an input of a reference voltage Vref. The other input terminal of the comparator 230 is connected to a switch 240. The switch 240 is provided between the comparator 230 and the linking parts 24. The switch 240 switches the linking parts 24 connected to the comparator 230 according to a switching signal from the CPU 210. In a case where the connected linking parts 24 hold the illumination units 6, the illumination units 6 are connected to the comparator 230 via the connected linking parts 24.

The illumination units 6 include different resistors $R_i$ having different resistance values for each type. For example, in the example shown in FIG. 9, the red illumination units 6r include resistors $R_1$, and the green illumination units 6g include resistors $R_2$. That is, the types of the illumination units 6 can be specified by specifying the types of the resistors $R_i$. In other words, the resistors $R_i$ corresponding to the types of the illumination units 6 function as the identification mechanisms of the illumination units 6.

Each resistor $R_i$ is connected to the comparator 230 via the linking part 24 and the switch 240. The comparator 230 sends to the CPU 210 a comparison result between voltages which have passed through the resistors $R_i$ and the reference voltage Vref. The CPU 210 transmits to the controller 100 channel information indicating the sent comparison result and channels CH (ch1~ch13) connected when the comparison result is obtained. Here, each of the channels ch1~ch13 is connected to a different linking part 24, respectively. Therefore, the channel information is also information indicating which linking part 24 among the plurality of linking parts 24 is connected.

Since the controller 100 can specify approximate values of the voltages based on the comparison result, the controller 100 can specify the types of the resistors $R_i$. In addition, since the controller 100 can determine which illumination unit 6 held by which linking part 24 among the plurality of linking parts 24 the comparison result is for based on the channel information, the controller 100 can specify which type of the illumination unit 6 is held by which linking part 24. Further, the substrate member 2 may have this function.

<E. Functional Configuration of Controller>

Figure 10:
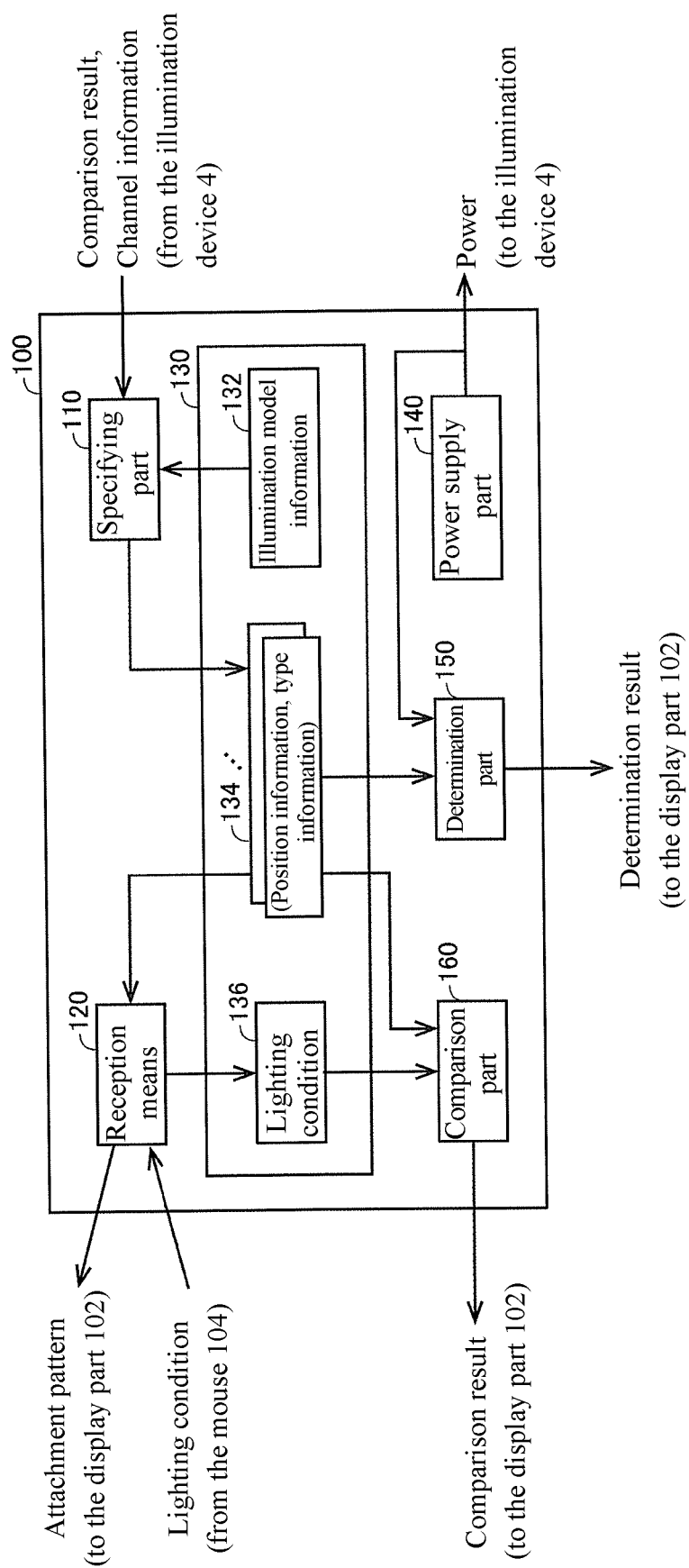
FIG. 10 is a diagram showing an example of a functional configuration of the controller.

FIG. 10 is a diagram showing an example of a functional configuration of the controller 100. The controller 100 includes a specifying part 110, which specifies the positions where the illumination units 6 are attached and the types of the attached illumination units 6; and a reception means 120, which displays information on the display part 102 and receives an operation by the mouse 104.

The specifying part 110 can specify which types of the illumination units 6 are held by which linking parts 24. In other words, the specifying part 110 can specify the positions where the illumination units 6 are connected. Further, the specifying part 110 can specify the types of the connected illumination units 6.

Specifically, the specifying part 110 receives the comparison result and the channel information from the illumination device 4. The specifying part 110 compares the resistance values of the resistors $R_i$ set for each type of the illumination units 6 with the resistance values obtained from the comparison result and searches to which resistors $R_i$ the resistance values obtained from the comparison result are classified. The specifying part 110 specifies the types of the illumination units 6 connected to the positions corresponding to the channel information based on the search result.

Further, the specifying part 110 may be configured to specify only the positions where the illumination units 6 are connected. The specifying part 110 associates information of the positions where the illumination units 6 are connected with information of the types of the illumination units 6 connected to the positions and stores the information as attachment pattern information 134 in a memory part 130. The memory part 130 may be, for example, a built-in memory of the controller 100 or may be an external memory. The external memory may be a memory that can be inserted directly into the controller 100 or may be a server that is communicably connected to the controller 100.

Further, the memory part 130 stores the resistance values of the resistors $R_i$ set for each type of the illumination units 6 as illumination model information 132. The illumination model information 132 is information in which the types of the illumination units 6 and the resistance values of the resistors $R_i$ are associated with each other. The resistance values of the resistors $R_i$ may have a range.

The reception means 120 controls display contents displayed on the display part 102 and also receives information from the mouse 104. The reception means 120 displays attachment patterns on the display part 102 based on the attachment pattern information 134, that is, based on the positions specified by the specifying part 110. Specifically, the reception means 120 displays a lightable area, which is an area where the illumination units are connected and can be lit, and an unlightable area, which is an area where the illumination units are not connected and cannot be lit, in different modes. In addition, the reception means 120 can receive settings of the lighting conditions for the lightable area via the mouse 104. Upon receiving the settings of the lighting conditions, the reception means 120 stores the received lighting conditions 136 in the memory part 130.

The controller 100 may include a power supply part 140 and a determination part 150. The power supply part 140 supplies power to the illumination units 6 connected to the substrate member 2 which is a part of the illumination device 4. The determination part 150 determines excess or deficiency of the power supplied from the power supply part 140 to the illumination units 6 connected to the illumination device 4 and outputs the determination result. Specifically, the determination part 150 determines by comparing an amount of power, which is necessary for driving all the illumination units 6 connected to the substrate member 2 and is calculated based on the attachment pattern information 134, and an amount of power supplied from the power supply part 140. An output destination is, for example, the display part 102. In addition, the output destination is not necessarily the display part 102, and may be, for example, a terminal, a printer, etc. communicably connected to the controller 100.

The controller 100 may include a comparison part 160. The comparison part 160 compares connection statuses of the illumination units 6 specified by the specifying part 110 with connection modes of the illumination units for satisfying the lighting conditions 136 stored in the memory part 130 and outputs the comparison result. An output destination is, for example, the display part 102. In addition, the output destination is not necessarily the display part 102, and may be, for example, a terminal, a printer, etc. communicably connected to the controller 100.

Further, the lighting conditions 136 stored in the memory part 130 may be received by the reception means 120 via the mouse 104 or may be stored in an external memory in advance. The connection modes of the illumination units for satisfying the lighting conditions 136 may indicate the lighting conditions 136 themselves. In addition, the comparison part 160 may judge whether or not the lighting conditions 136 can be satisfied under the connection statuses specified by the specifying part 110 without clarifying the connection modes.

For example, in a case where a lighting condition requiring the coaxial incident illumination is stored in the memory part 130 but the illumination unit 6a corresponding to the coaxial incident illumination is not connected, the comparison part 160 outputs that the illumination unit 6a corresponding to the coaxial incident illumination is not connected.

Each of these functional configurations is realized by the CPU of the controller 100 executing a setting program stored in an internal memory, etc. included in the controller 100.

<F. User Interface>

In the present embodiment, the illumination units 6 are detachably held by the holding mechanism such as the connection parts 68 and the linking parts 24. That is, the illumination units 6 can be detachably connected to the positions where the linking parts 24 are provided. As a result, it is sufficient to prepare only the illumination units 6 necessary for realizing the irradiation patterns to be irradiated, and the cost can be reduced.

Figure 11:
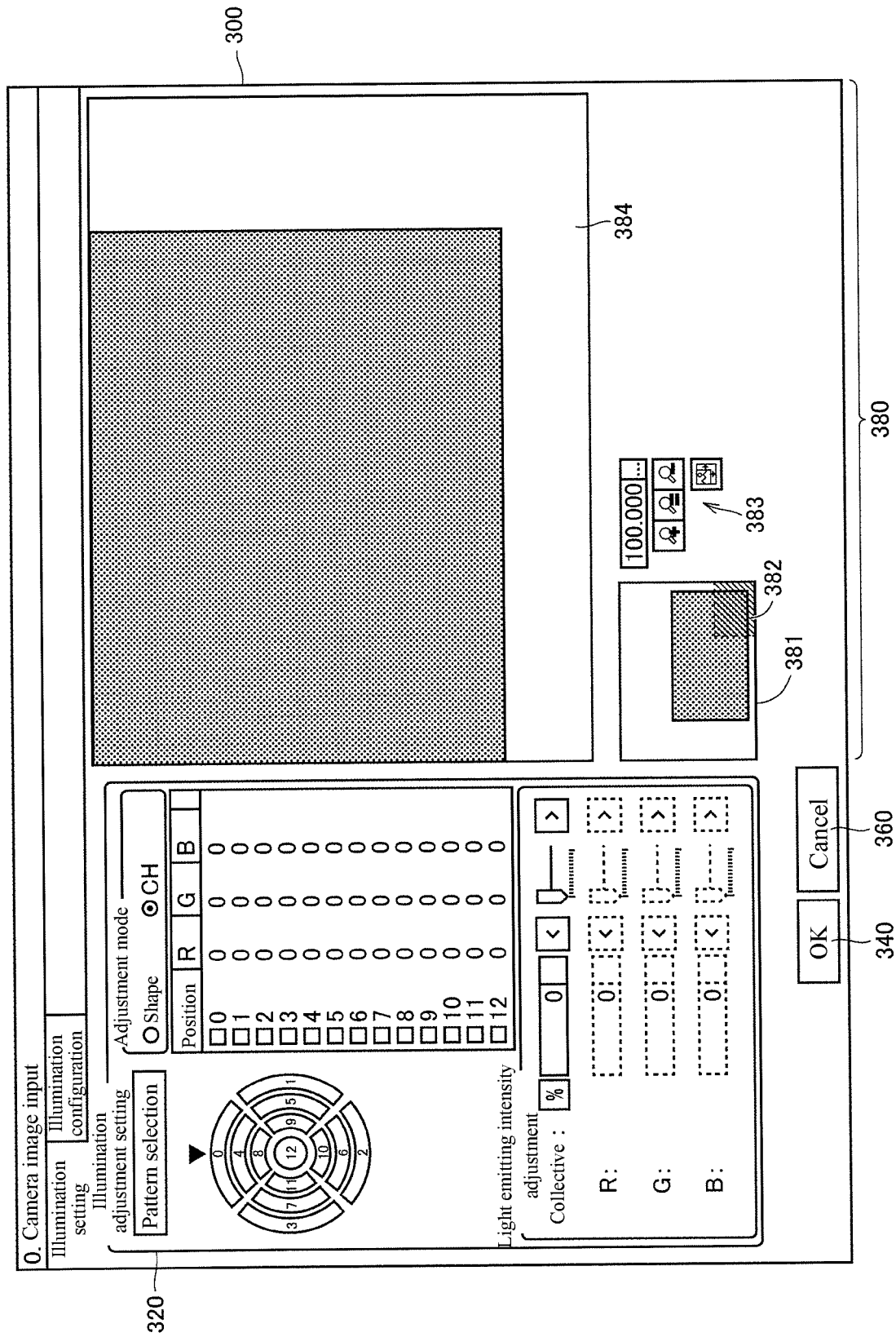
FIG. 11 is a user interface screen at the time of illumination setting.

At this time, since there are a plurality of attachment patterns of the illumination units 6 when the lighting conditions of the illumination device 4 to which the illumination units 6 are attached are determined, a user interface for setting according to the attachment patterns is required. FIG. 11 is a user interface screen 300 at the time of illumination setting. Here, the attachment patterns are defined by the positions where the illumination units 6 are held and by the types of the held illumination units 6. Further, the display mode of the user interface screen 300 shown in FIG. 11 is controlled by the reception means 120.

The user interface screen 300 shown in FIG. 11 includes an illumination setting area 320, an OK button 340, a cancel button 360, and a lighting state confirmation area 380.

When the OK button 340 is operated after various buttons included in the illumination setting area 320 are operated and the lighting conditions are set, the controller 100 stores the set lighting conditions in a hard disk, which is included in the controller 100 as the memory part, or in the memory part 130 such as a server communicably connected to the controller 100. On the other hand, when the cancel button 360 is operated, the set lighting conditions are cleared.

The lighting state confirmation area 380 displays the image obtained by the camera 8. The image displayed in the lighting state confirmation area 380 is updated in real time. When the user operates various buttons or various icons included in the illumination setting area 320 and sets the lighting setting, the controller 100 instructs the illumination device 4 to be lit according to the contents of the set lighting setting. That is, the controller 100 updates the lighting setting of the illumination device 4 in real time. As a result, the lighting state confirmation area 380 displays the image when the illumination device is controlled by the lighting setting set by the user by operating various buttons or various icons included in the illumination setting area 320. In this way, the user can determine the lighting conditions while checking the image obtained under the set lighting conditions.

The lighting state confirmation area 380 includes an entirety display area 381, a display control icon group 383, and an image display area 384. The entirety display area 381 and the image display area 384 display the image obtained by the camera 8. The entirety display area 381 displays an entirety of the image of the object independently of a display scope in the image display area 384. The entirety display area 381 shows an image of a display scope 382 to be displayed in the image display area 384. The display scope 382 is changed according to a user operation (such as enlargement or shrinkage) with respect to the display control icon group 383, and the display scope and the display resolution of the image displayed in the image display area 384 are changed according to the user operation with respect to the display control icon group 383.

Figure 12:
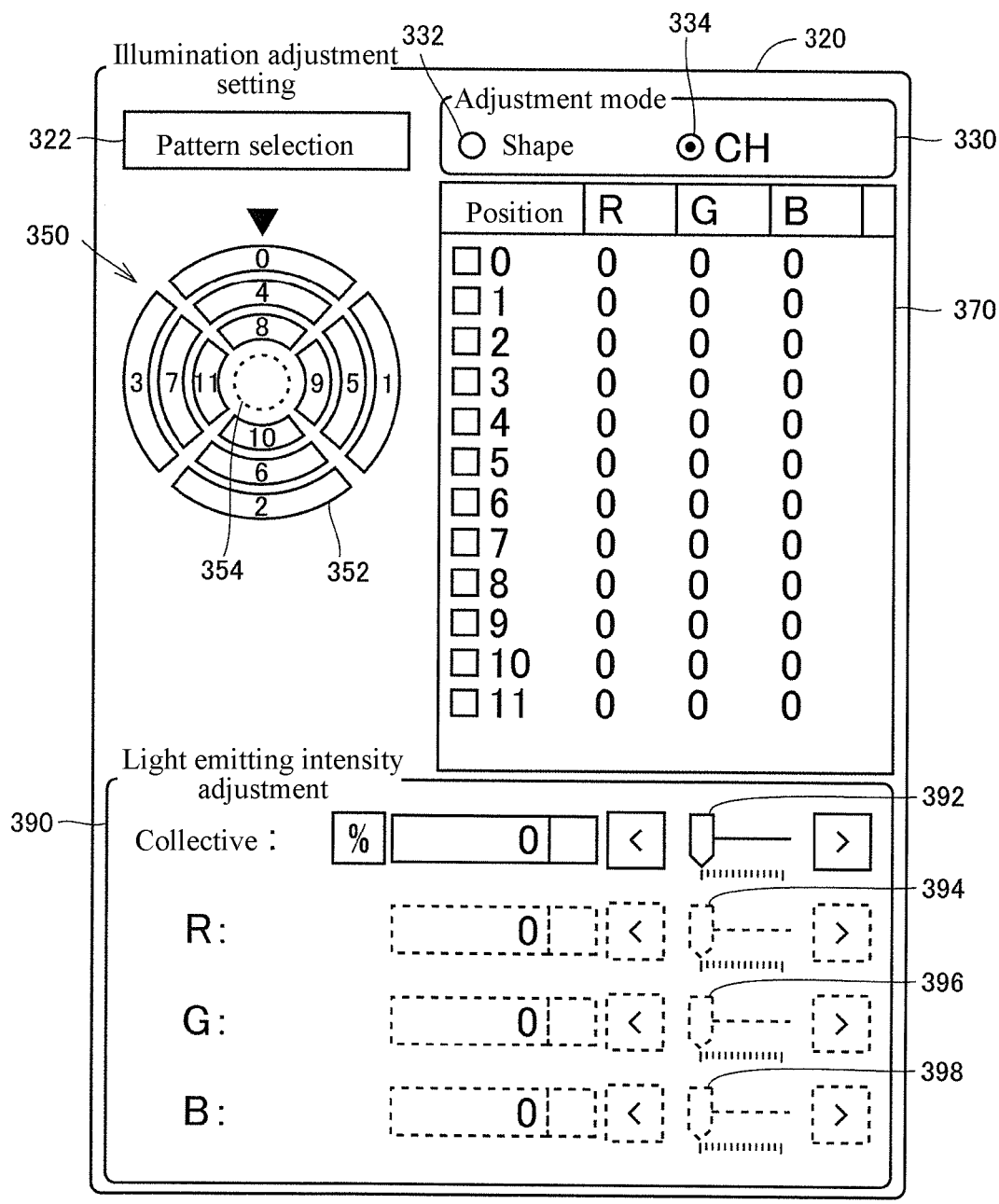
FIG. 12 is a diagram for explaining the illumination setting area.

FIG. 12 is a diagram for explaining the illumination setting area 320. The illumination setting area 320 includes a pattern selection button 322, an adjustment mode selection area 330, a setting content display area 350, an adjustment target selection area 370, and a luminance adjustment area 390.

When the pattern selection button 322 is operated, the controller 100 specifies which types of the illumination units 6 are attached to which positions on the substrate member 2 based on the information regarding the types of the illumination units 6 obtained from each channel CH. For example, the controller 100 instructs the CPU 210 included in the substrate member 2 to obtain the comparison result for each channel CH. In this way, the controller 100 can obtain the comparison result for each channel CH and specifies the attachment patterns, which are the connection statuses of the illumination units 6, based on the comparison result.

Further, the controller 100 displays the attachment patterns of the specified illumination units 6. Specifically, the controller 100 graphically displays the attachment patterns in the setting content display area 350. FIG. 12 shows a display example in a case where the illumination unit 6a functioning as the coaxial incident illumination is not attached and all the illumination units 6 are installed on the linking parts 24 provided on the lower surface side of the substrate member 2. As shown in FIG. 12, when the area where the illumination units 6 are attached is defined as the lightable area 352 in the illumination device 4, the lightable area 352 and the unlightable area 354 where the illumination units 6 are not attached are shown in different modes.

The phrase "shown in different modes" includes displaying only the lightable area 352 without showing the unlightable area 354; further, as shown in FIG. 12, it is not limited to a graphical display but may be displayed by words. For example, the positions where the linking parts 24 are provided may be represented by words such as numerals, and the lightable area and the unlightable area may be represented by representing words corresponding to the linking parts 24 where the illumination units 6 are attached in black words and representing words corresponding to the linking parts 24 where the illumination units 6 are not attached in gray words. In the example shown in FIG. 12, the unlightable area 354 is indicated by a broken line, and the lightable area 352 is indicated by a solid line. In addition, some reference numerals are omitted in FIG. 12.

The adjustment mode selection area 330 includes buttons for selecting methods for adjusting the lighting conditions. Specifically, a shape button 332 and a channel button 334 are included. When the shape button 332 is selected, the display of the adjustment target selection area 370 is switched to a display for selecting selectable irradiation patterns. When the channel button 334 is selected, the display of the adjustment target selection area 370 is switched to a display for adjusting the lighting conditions of the illumination units 6 attached to the substrate member 2 one by one. In the example shown in FIG. 12, the channel button 334 is selected. Here, the numbers shown in the column of "Position" inside the adjustment target selection area 370 and the numbers shown in the setting content display area 350 are numbers indicating each of the channels CH. That is, the numbers shown in the "Position" column and the numbers shown in the setting content display area 350 are in a corresponding relationship. Specifically, in a case where a position indicating "0" is selected, the lighting conditions of the area to which "0" is attached can be adjusted.

Here, the irradiation patterns are modes of light irradiated from the illumination device 4. Specifically, the irradiation patterns are defined by the lit positions, the colors of the lit light, and the intensities of the lit light. The selectable irradiation patterns mean the irradiation patterns that can be selected depending on the positions where the illumination units 6 are attached and/or the types of the attached illumination units 6.

The luminance adjustment area 390 includes various buttons for adjusting the intensity of the light irradiated from the illumination units 6 selected as an adjustment target in a case where the adjustment target is selected by various buttons included in the adjustment target selection area 370. Specifically, the luminance adjustment area 390 includes a collective luminance adjustment bar 392 for adjusting the luminance of all the light sources 64 regardless of the types of the light sources 64, a red luminance adjustment bar 394 for adjusting the luminance of the red light sources 64r, a green luminance adjustment bar 396 for adjusting the luminance of the green light sources 64g, and a blue luminance adjustment bar 398 for adjusting the luminance of the blue light sources 64b.

Figure 13A:
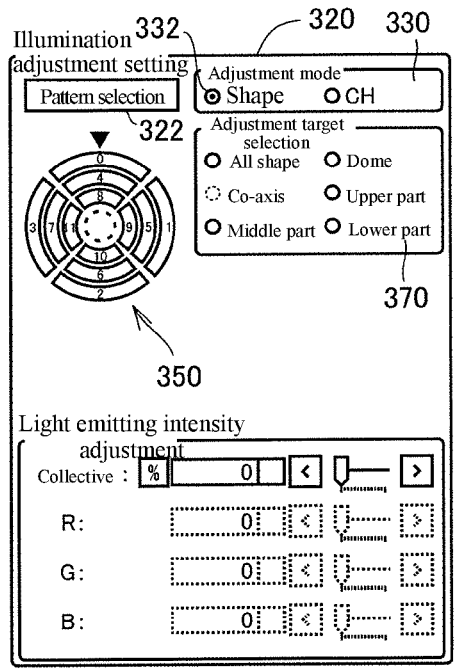
FIGS. 13A to 13D are diagrams showing an example of a flow for setting the lighting conditions.

FIGS. 13A to 13D are diagrams showing an example of a flow for setting the lighting conditions. When the pattern selection button 322 is operated, as shown in FIG. 13A, the setting content display area 350 displays the attachment patterns graphically, and the adjustment target selection area 370 displays selectable areas according to the attachment patterns.

FIG. 13A shows a display example in a case where the illumination unit 6a functioning as the coaxial incident illumination is not attached and all the illumination units 6 are installed on the linking parts 24 provided on the lower surface side of the substrate member 2. Further, a case where 13 linking parts 24 are provided on the substrate member 2 is described. In the example shown in FIG. 13A, the shape button 332 is selected. The adjustment target selection area 370 presents candidates of the selectable irradiation patterns according to the attachment patterns.

In the example shown in FIG. 13A, since the illumination unit 6a functioning as the coaxial incident illumination is not attached, the irradiation pattern of "Co-axis," which is a candidate of the irradiation pattern that cannot be satisfied unless the coaxial incident illumination is provided, cannot be selected. Further, the irradiation pattern of "Co-axis" is an irradiation pattern for lighting only the illumination unit 6a which is the coaxial incident illumination. In the example shown in FIG. 13A, a button corresponding to the irradiation pattern which cannot be selected is indicated by a broken line. Further, the irradiation pattern that cannot be selected may not be displayed in the adjustment target selection area 370 or may be displayed in a mode different from the mode shown in FIG. 13A.

Figure 13B:
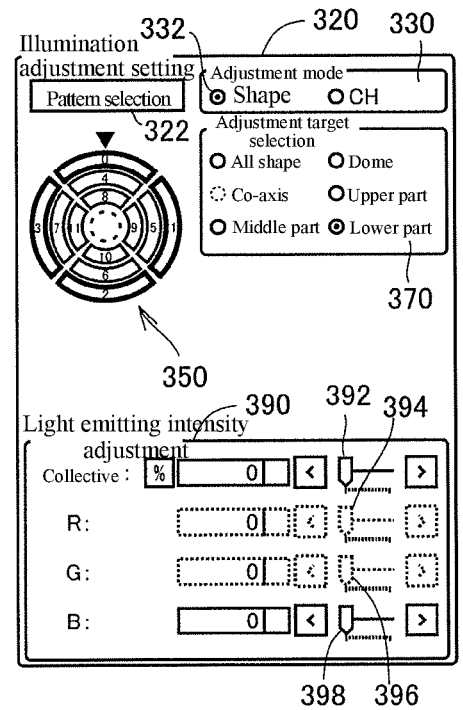

When the user selects one irradiation pattern among the irradiation patterns presented in the adjustment target selection area 370 by operating the mouse 104 which is the input part, as shown in FIG. 13B, a lighting area to be lit for realizing the selected irradiation pattern is displayed in a mode different from other areas. Specifically, when "Lower part" is selected, the controller 100 displays an area located in the outermost shape in the setting content display area 350 and the other areas in different modes. In this way, the user can recognize which illumination units 6 are to be lit according to the selected irradiation pattern.

The controller 100 may be configured to be able to adjust only the luminance corresponding to adjustable colors according to the types of the illumination units 6 included in the lighting area. Specifically, among the luminance adjustment bars included in the luminance adjustment area 390, the controller 100 can operate only the luminance adjustment bars of the colors of the illumination irradiated from the illumination units 6 included in the lighting area. In the example shown in FIG. 13B, all the illumination units 6 attached to the outermost circumference include only the blue light sources 64b. In this case, the controller 100 may show the red luminance adjustment bar 394 and the green luminance adjustment bar 396 in a mode indicating that they cannot be selected. In the example shown in FIG. 13B, the unselectable red luminance adjustment bar 394 and the unselectable green luminance adjustment bar 396 are indicated by broken lines. In other words, the selectable irradiation patterns are displayed according to the types of the illumination units 6.

Figure 13C:
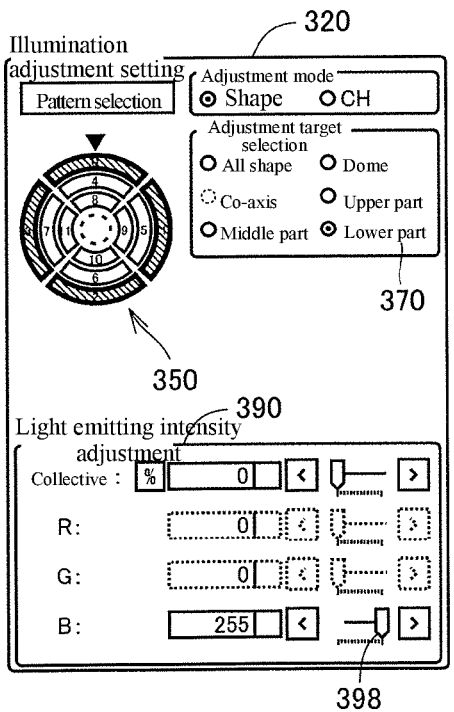

FIG. 13C is a display example when the luminance is adjusted by operating the blue luminance adjustment bar 398 in the state shown in FIG. 13B. As shown in FIG. 13C, the setting content display area 350 reflects the state where the luminance is adjusted. For example, the selected area is displayed in a mode fully colored in blue.

Figure 13D:
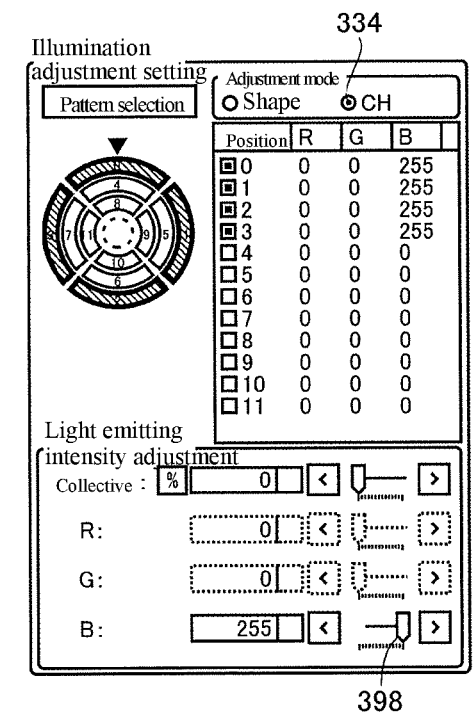

FIG. 13D is a display example when the channel button 334 is operated in the state shown in FIG. 13C. The display of the adjustment target selection area 370 is switched and displays a mode in which the tabs of the channels indicating the positions on the outermost circumference are selected.

Figure 14C:
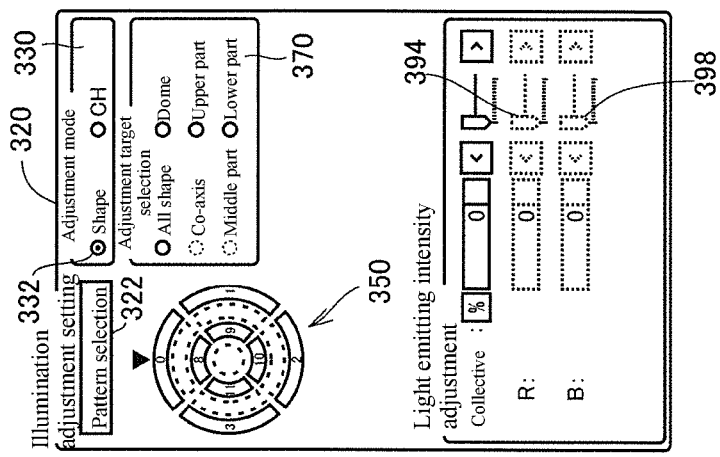
FIGS. 14A to 14C are diagrams showing a display of the illumination setting area according to the connection statuses of the illumination units.
Figure 14B:
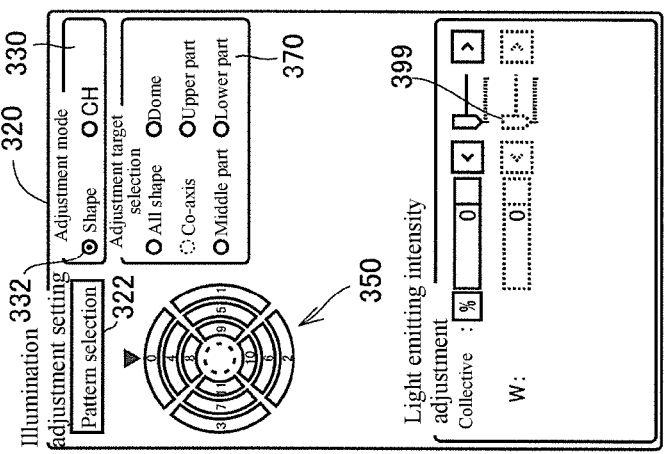
Figure 14A:
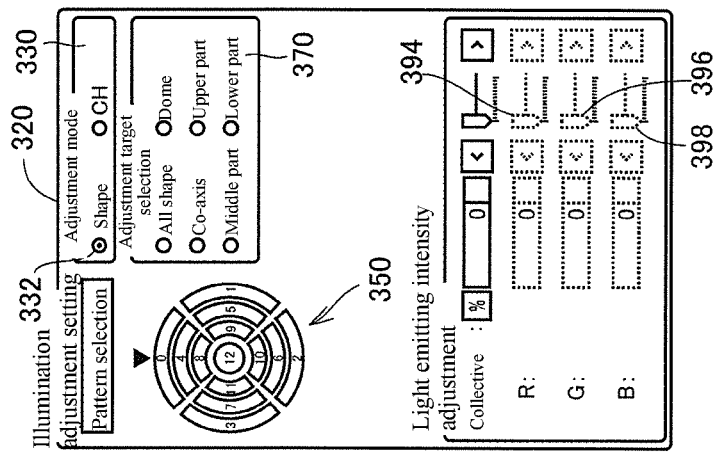

FIGS. 14A to 14C are diagrams showing the display of the illumination setting area 320 according to the connection statuses of the illumination units 6. FIGS. 14A to 14C describe cases where the shape button 332 is selected.

FIG. 14A is a diagram showing the display of the illumination setting area 320 in a situation where the illumination units 6 are provided in all of the plurality of linking parts 24 provided on the substrate member 2. Further, in FIG. 14A, the red illumination units 6r, the green illumination units 6g, and the blue illumination units 6b are connected to the substrate member 2.

FIG. 14B is a diagram showing the display of the illumination setting area 320 in a situation where, among the plurality of linking parts 24 provided on the substrate member 2, the illumination units 6 are connected to all of the linking parts 24 other than the linking part 24 to which the illumination unit 6a functioning as the coaxial incident illumination is connected. Further, in FIG. 14B, the plurality of illumination units 6 connected to the substrate member 2 all are the white illumination units 6w.

FIG. 14C is a diagram showing the display of the illumination setting area 320 in a situation where, among the plurality of linking parts 24 provided on the substrate member 2, the illumination units 6 are connected to all of the linking parts 24 other than the linking part 24 to which the illumination unit 6a functioning as the coaxial incident illumination is connected and other than all of the linking parts 24 disposed on the circumference of the circle having the medium-sized diameter. Further, in FIG. 14C, the red illumination units 6r and the blue illumination units 6b are connected to the substrate member 2.

Since the candidates of the selectable irradiation patterns change depending on which linking parts 24 are connected with the illumination units 6, as shown in FIGS. 14A to 14C, the display of the adjustment target selection area 370 changes. In FIGS. 14A to 14C, selection buttons for the candidates of the selectable irradiation patterns are indicated by solid lines, and selection buttons for the candidates of the unselectable irradiation patterns are indicated by broken lines.

Specifically, as shown in FIG. 14A, in a situation where the illumination units 6 are provided in all of the plurality of linking parts 24 provided on the substrate member 2, the user can select all of the irradiation patterns illustrated in the adjustment target selection area 370. On the other hand, as shown in FIG. 14B, in a case where the illumination unit 6a is not attached, the irradiation pattern of "Co-axis" cannot be selected. Further, in FIG. 14C, since the illumination unit 6a is not attached and all of the linking parts 24 disposed on the circumference of the circle having the medium-sized diameter are not attached with the illumination units 6, the user can select neither the irradiation pattern of "Co-axis" nor the irradiation pattern of "Middle part." That is, the adjustment target selection area 370 displays the selectable irradiation patterns according to the positions where the illumination units 6 are attached.

Further, since the irradiation patterns that can be irradiated vary according to the types of the illumination units 6 attached to the substrate member 2, the display of the luminance adjustment area 390 changes depending on the types of the illumination units 6, as shown in FIGS. 14A to 14C.

Specifically, as shown in FIG. 14A, in a case where the red illumination units 6r, the green illumination units 6g, and the blue illumination units 6b are connected to the substrate member 2, the red luminance adjustment bar 394, the green luminance adjustment bar 396, and the blue luminance adjustment bar 398 are displayed as the luminance adjustment bars in the luminance adjustment area 390. On the other hand, as shown in FIG. 14B, in a case where only the white illumination units 6w are connected to the substrate member 2, only the white luminance adjustment bar 399 is displayed as the luminance adjustment bar in the luminance adjustment area 390. Further, as shown in FIG. 14C, in a case where the red illumination units 6r and the blue illumination units 6b are connected to the substrate member 2, the red luminance adjustment bar 394 and the blue luminance adjustment bar 398 are displayed as the luminance adjustment bars in the luminance adjustment area 390. In other words, the luminance adjustment area 390 displays the selectable irradiation patterns according to the types of the illumination units 6.

Figure 15:
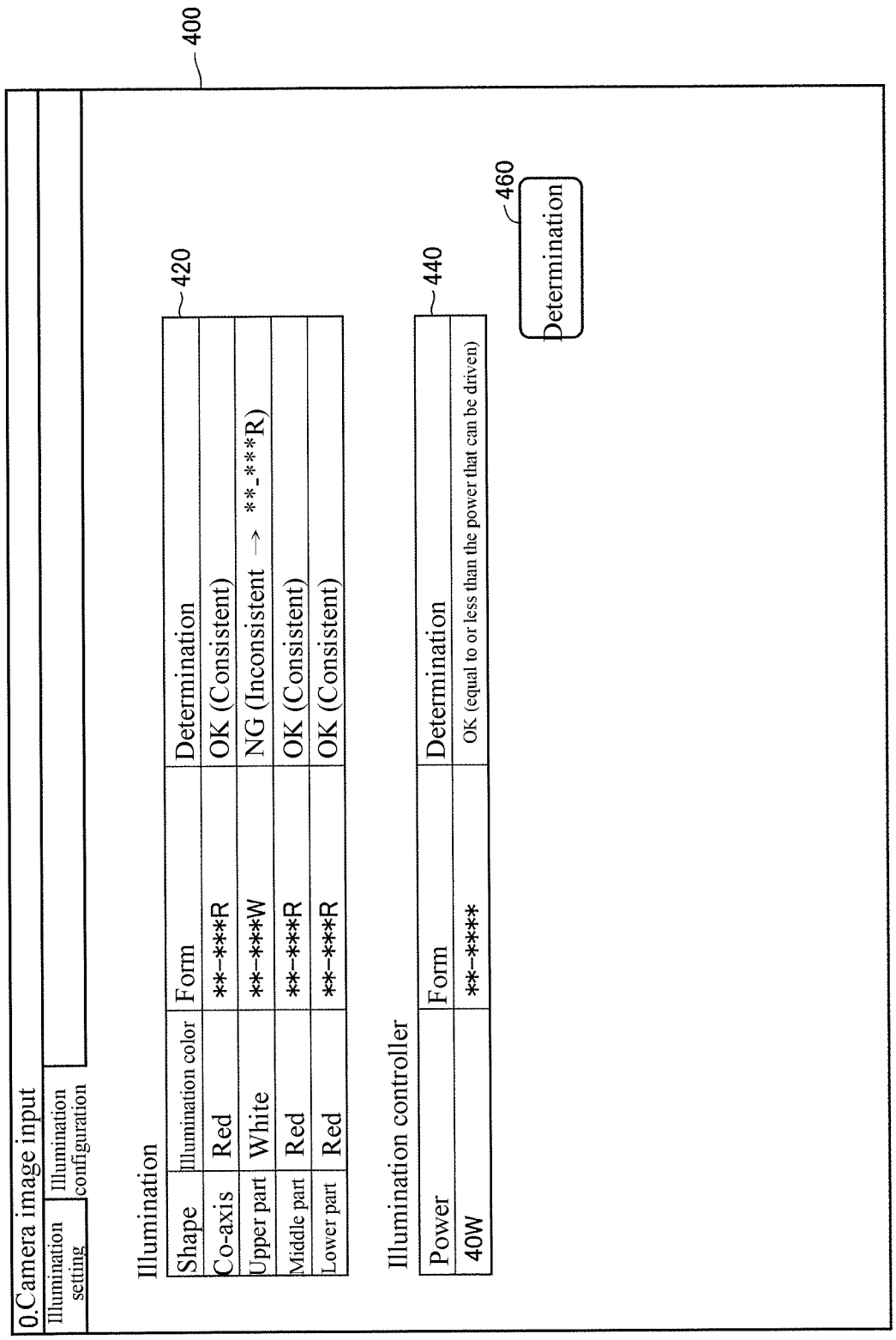
FIG. 15 is a user interface screen for displaying results of the connection statuses of the illumination units.

FIG. 15 is a user interface screen 400 for displaying results of the connection statuses of the illumination units 6.

The user interface screen 400 includes a comparison result display area 420 for showing the comparison result of the comparison part 160, a determination result display area 440 for showing the determination result of the determination part 150, and a determination button 460 for starting the determination.

When the user operates the determination button 460 via the input part such as the mouse 104, the comparison result of the comparison part 160 is displayed in the comparison result display area 420, and the determination result of the determination part 150 is displayed in the determination result display area 440.

<G. Modified Example of Holding Mechanism>

Figure 16:
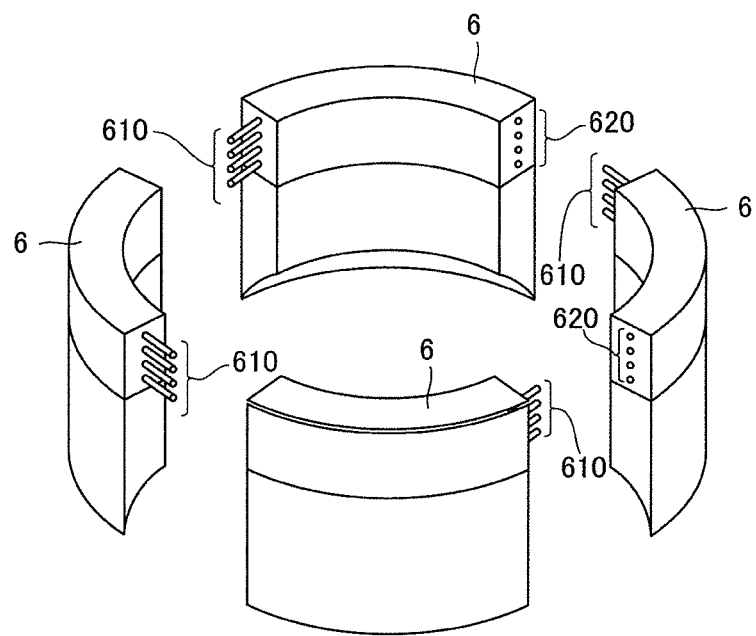
FIG. 16 is a diagram showing a modified example of the holding mechanism.

The above embodiment shows an example in which the illumination units 6 are detachably held on the substrate member 2 having the holding mechanism. The holding mechanism may be formed integrally with the illumination units and may be configured to link the plurality of illumination units to one another according to the predetermined disposition rule. FIG. 16 is a diagram showing a modified example of the holding mechanism.

As shown in FIG. 16, the illumination unit 6 includes a connection part 620 and a linking part 610, wherein the connection part 620 is linked to the linking part 610 provided on an end part of one illumination unit 6, and the linking part 610 is linked to the connection part 620 of another illumination unit.

The plurality of illumination units 6 are held to one another by linking the linking part 610 of one illumination unit 6 to the connection part 620 of another illumination unit 6. At this time, the plurality of illumination units 6 cannot be disposed at any relative position, and the disposition locations are defined by the position of the linking part 610 and the position of the connection part 620 provided on each of the illumination units 6. In other words, the plurality of illumination units 6 are held to one another according to the predetermined disposition rule.

<H. Modified Example of Identification Mechanism>

In the present embodiment, the identification mechanisms are the resistors $R_i$ corresponding to the types of the illumination units 6. The identification mechanisms may be, for example, memories stored with the identification information regarding the types of the illumination units 6 in advance or the shapes of the entirety or a part of the illumination units 6. The illumination device 4 may have a reading mechanism corresponding to the types of the identification mechanisms.

In a case where the resistors $R_i$ or the shapes are made to have identifiability, since it is unnecessary to provide memories, the illumination units 6 can be produced at low costs. On the other hand, since the illumination units 6 can be finely identified by providing memories, the classification of the illumination units 6 can be finely performed.

Further, marks indicating the types of the illumination units 6 may be provided on positions which are on the surfaces of the housings 62 of the illumination units 6 and are exposed even after being installed to the illumination device 4.

Further, the function of the specifying part 110 may be included in the substrate member 2, that is, in the illumination device 4. For example, the CPU 210 provided in the substrate member 2 may perform the function as the specifying part 110. Further, a memory may be provided in the substrate member 2, and the attachment pattern information 134 stored in the controller 100 may be stored in the memory.

<I. Modified Example of Illumination Device>

In the present embodiment, in a case where the three types of the illumination units 6 having different shapes of the upper surfaces and with the respective heights and shapes of the lower surfaces are attached to the corresponding linking parts 24, it is configured that a surface formed by the plurality of diffusion plates 66 forms a dome shape. However, the respective heights of the three types of the illumination units 6 having different shapes of the upper surfaces may be equal, and shapes of light guide plates of the respective illumination units 6 may be shapes matching the shapes of the upper surfaces. That is, the illumination device 4 may be configured so that the shape of the light emitting surfaces formed by the diffusion plates 66 is a shape like a so-called ring illumination in a case where the illumination units 6 are attached to all of the plurality of linking parts 24 provided on the substrate member 2. Further, though the present embodiment has shown an example in which the linking parts 24 are disposed in a ring shape, the linking parts 24 may be disposed in a rectangular frame shape, and in this case, the shape of the housing 62 of the illumination unit 6 may be a rectangular parallelepiped, a truncated square pyramid, etc.

<J. Information Storage Destination>

The present embodiment has described a case where all the information is stored in one memory part 130, but it may be configured that a plurality of memory parts 130 are provided, and at least a part of a plurality pieces of information is stored in different memory parts 130.

<K. Action/Effect>

As described above, the illumination units 6 can be attached to the illumination device 4 according to the predetermined disposition rule. Therefore, it is sufficient to prepare only the illumination units 6 necessary for realizing the irradiation patterns to be irradiated, and the cost can be reduced. Further, the illumination units 6 are detachably attached, which can therefore increase the degree of freedom in the illumination design.

The holding mechanism for the illumination units 6 is configured by attaching the connection parts 68 provided on the illumination units 6 to the linking parts 24 provided on the substrate member 2. Since the locations for attaching the illumination units 6 are designed in advance, the attachment is easy.

The connection part 22 for electrically connecting with the controller 100 is provided on the substrate member 2, and the illumination units 6 and the controller 100 are electrically connected by attaching the illumination units 6 to the substrate member 2, and the lighting control of the illumination units 6 is performed by the controller 100. In other words, it is unnecessary to electrically connect the controller 100 with the illumination units 6 one by one, and the electrical connection and the mechanical connection can be integrated, and the structure can be simplified, and the design of the illumination device 4 becomes easy.

In addition, as shown in FIG. 16, the illumination units 6 may be held by being linked to one another even when the substrate member 2 is not provided. Since the substrate member 2 is not necessary, the shape of the entire illumination device 4 can be made smaller.

The illumination units 6 include the red illumination units 6r, which are an example of first illumination units whose dominant wavelength of irradiated light is a first wavelength; and the green illumination units 6g and the blue illumination units 6b, which are an example of second illumination units whose dominant wavelength of irradiated light is a second wavelength different from the first wavelength. Therefore, the illumination device 4 having different dominant wavelengths of the irradiated light can be created through combinations of the illumination units 6, and the versatility of the illumination device 4 is increased.

The illumination units 6 have different resistors $R_i$ depending on the types of the illumination units 6. Since the types of the illumination units 6 can be determined by specifying the types of the resistors $R_i$, the user can specify which types of the illumination units 6 have been attached or are to be attached, and the usability is increased.

The illumination units 6 include the plurality types of the illumination units 6 having different shapes of the housings 62. Therefore, the variation of the irradiation patterns at the time of irradiation can be increased, and the versatility of the illumination device 4 is increased.

Further, the controller 100 includes the specifying part 110 for specifying the positions where the illumination units 6 are attached and the reception means 120. The reception means 120 presents the lightable area 352 and the unlightable area 354 in different modes based on the positions specified by the specifying part 110 and also receives the settings of the lighting conditions for the lightable area 352. In this way, since the controller 100 presents the lightable area 352 and the unlightable area 354 in different modes, the user can easily recognize the area that can be lit, and as a result, the user can set the illumination setting easily.

Further, in a case where the shape button 332 is selected, the adjustment target selection area 370 presents the candidates of the selectable irradiation patterns according to the attachment patterns of the illumination units 6. Then, it is configured that one irradiation pattern can be selected from the candidates. Therefore, it is only necessary to select from the irradiation patterns that can be actually irradiated, and the lighting setting becomes easier as compared with a case where the lighting setting is set for the attached illumination units 6 one by one.

In addition, types of adjustable luminance are presented according to the types of the attached illumination units 6. In other words, the selectable irradiation patterns are presented according to the types of the illumination units 6. Therefore, the user can be prevented from erroneously setting lighting conditions that cannot be set in a case where the irradiation patterns that can be set differ according to the types of the attached illumination units 6, thereby increasing the usability.

The controller 100 includes the power supply part 140 and the determination part 150. The determination part 150 determines whether all of the attached illumination units 6 can be lit based on the power supplied by the power supply part 140 and outputs the determination result. Therefore, the user can know in advance whether the attached illumination units 6 can be lit.

The controller 100 further includes the comparison part 160 for comparing the lighting conditions 136 stored in the memory part 130 with the connection statuses of the illumination units 6 specified by the specifying part 110 and outputting the comparison result. Therefore, the user can know in advance whether the way of attaching the illumination units 6 is correct. For example, in a case where the image measurement is performed under common lighting conditions at a plurality of sites, it is necessary to assemble a plurality of illumination devices 4 with the same attachment pattern. In this case, there is also a concern of making mistakes in the way of assembly. In such a case, since errors in the way of assembly can be output in advance by the comparison part 160, the user can recognize the errors in the way of assembly at an early stage.

Further, the image processing system 1 includes the camera 8. The image imaged by the camera 8 under the lighting conditions received by the reception means 120 is displayed. Therefore, the user can determine the lighting conditions while checking the image obtained under the set lighting conditions.

<L. Appendix>

As described above, the present embodiments include the following disclosure.

[Configuration 1]

An illumination device (4) for irradiating light on an object (W) in image measurement which performs an appearance inspection of the object (W), including:
    an illumination unit (6) for irradiating light on the object (W);
    a holding mechanism (24, 68, 610, 620) for detachably holding the illumination unit (6) according to a predetermined disposition rule; and
    a connection part (22) for electrically connecting with a controller (100) which performs a lighting control of the illumination unit (6) held by the holding mechanism (24, 68, 610, 620).

[Configuration 2]

The illumination device according to configuration 1, wherein the holding mechanism includes a substrate member (2) provided with a plurality of linking parts (24) detachably linked to an end part (68) of the illumination unit (6) according to the predetermined disposition rule, and the end part (68) is provided at a position different from a light emitting surface (66) of the illumination unit (6).

[Configuration 3]

The illumination device according to configuration 2, wherein the connection part (22) is formed integrally with the substrate member (2), and
    the lighting control of the illumination unit (6) is performed by the controller (100) by connecting the end part (68) of the illumination unit (6) to one linking part (24) among the plurality of linking parts.

[Configuration 4]

The illumination device according to configuration 1, wherein the holding mechanism (610, 620) is formed integrally with the illumination unit (6) and links a plurality of illumination units (6) to one another according to the predetermined disposition rule.

[Configuration 5]

The illumination device according to any one of configurations 1 to 4, wherein the illumination unit (6) includes:
    a first illumination unit (6r) whose dominant wavelength to be irradiated is a first wavelength; and
    a second illumination unit (6g, 6b) whose dominant wavelength to be irradiated is a second wavelength different from the first wavelength.

[Configuration 6]

The illumination device according to configuration 5, wherein the illumination unit (6) includes an identification mechanism ($R_i$) for identifying which illumination unit among the first illumination unit (6r) and the second illumination unit (6g, 6b) is held.

[Configuration 7]

The illumination device according to any one of configurations 1 to 6, wherein the illumination unit (6) includes:
    an illumination unit (6c) having a housing (62) in a first shape; and
    an illumination unit (6d, 6e) having a housing (62) in a second shape different from the first shape.

[Configuration 8]

An illumination unit (6) included in an illumination device (4) for irradiating light on an object (W) in image measurement which performs an appearance inspection of the object (W), including:
    a holding mechanism (68) to be detachably held at a predetermined position of the illumination device; and
    a connection part (68) for electrically connecting with a controller which performs a lighting control of the illumination device.

[Configuration 9]

An image processing system (1) for performing image measurement with use of an appearance image of an object (W), including:
    an imaging part (8) for imaging the object (W) and generating the appearance image;
    an illumination device (4) for irradiating light on the object (W); and
    a controller (100) for controlling the illumination device (4) and the imaging part (8),
    wherein the illumination device (4) includes:
        an illumination unit (6) for irradiating light on the object (W);
        a holding mechanism (24, 68, 610, 620) for detachably holding the illumination unit (6) according to a predetermined disposition rule; and
        a connection part (22) for electrically connecting with the controller (100).

Each of the embodiments disclosed herein is exemplary and should not be construed restrictive in all aspects. The scope of the disclosure is defined by the claims instead of the above descriptions, and it is intended to include the equivalent of the scope of the claims and all modifications within the scope. In addition, the disclosure described with the embodiments and each of the modified examples is intended to be implemented independently or with combinations thereof within the possible scope.

What is claimed is:

1. An illumination device for irradiating light on an object in image measurement which performs an appearance inspection of the object, comprising:
    a light source-irradiating light on the object;
    a holding mechanism for detachably holding the light source according to a predetermined disposition rule, the light source is detachable for adjusting the number and disposition of light sources held by the holding mechanism; and
    a mechanical connector electrically connecting with a hardware controller which performs a lighting control of the light source held by the holding mechanism,
    wherein the light source comprises:
        a first light source whose dominant wavelength to be irradiated is a first wavelength; and
        a second light source whose dominant wavelength to be irradiated is a second wavelength different from the first wavelength, and wherein the first light source and the second light source respectively comprises a first resistor corresponding to the first light source and a second resistor corresponding to the second light source for identifying which light source among the first light source and the second light source is held, the hardware controller identifies which light source among the first light source and the second light source is held by the holding mechanism according to the first resistor and the second resistor;

a switch coupled to the first resistor and the second resistor;

a comparator coupled to the switch and the hardware controller, the switch switches the first resistor and the second resistor connected to the comparator according to a switching signal, the comparator compares voltages provided by the first resistor and the second resistor with a reference voltage and generates comparison results; and a display coupled to the hardware controller, the hardware controller controls the display to display irradiation patterns according to the comparison results, wherein the irradiation patterns indicate characteristics of the light irradiated by the illumination device.

2. The illumination device according to claim 1, wherein the holding mechanism comprises a substrate member provided with a plurality of linking parts detachably linked to an end part of the light source according to the predetermined disposition rule, and the end part is provided at a position different from a light emitting surface of the light source.

3. The illumination device according to claim 2, wherein the mechanical connector is formed integrally with the substrate member, and the lighting control of the light source is performed by the hardware controller by connecting the end part of the light source to one linking part among the plurality of linking parts.

4. The illumination device according to claim 1, wherein the holding mechanism is formed integrally with the light source and links a plurality of light sources to one another according to the predetermined disposition rule.

5. The illumination device according to claim 1, wherein the light source comprises:
a light source having a housing in a first shape; and
a light source having a housing in a second shape different from the first shape.

6. The illumination device according to claim 2, wherein the light source comprises:
a light source having a housing in a first shape; and
a light source having a housing in a second shape different from the first shape.

7. The illumination device according to claim 3, wherein the light source comprises:
a light source having a housing in a first shape; and
a light source having a housing in a second shape different from the first shape.

8. The illumination device according to claim 4, wherein the light source comprises:
a light source having a housing in a first shape; and
a light source having a housing in a second shape different from the first shape.

9. An image processing system for performing image measurement with use of an appearance image of an object, comprising:
a camera configured to image the object and generating the appearance image;
an illumination device for irradiating light on the object; and
a hardware controller configured to control the illumination device and the imaging part,
wherein the illumination device comprises:
a light source irradiating light on the object;
a holding mechanism for detachably holding the light source according to a predetermined disposition rule, the light source is detachable for adjusting the number and disposition of light sources held by the holding mechanism,
wherein the light source comprises:
a first light source whose dominant wavelength to be irradiated is a first wavelength; and
a second light source whose dominant wavelength to be irradiated is a second wavelength different from the first wavelength, and wherein the first light source and the second light source respectively comprises a first resistor corresponding to the first light source and a second resistor corresponding to the second light source for identifying which light source among the first light source and the second light source is held, the hardware controller identifies which light source among the first light source and the second light source is held by the holding mechanism according to the first resistor and the second resistor;
a switch coupled to the first resistor and the second resistor;
a comparator coupled to the switch and the hardware controller, the switch switches the first resistor and the second resistor connected to the comparator according to a switching signal, the comparator compares voltages provided by the first resistor and the second resistor with a reference voltage and generates comparison results; and
a display coupled to the hardware controller, the hardware controller controls the display to display irradiation patterns according to the comparison results, wherein the irradiation patterns indicate characteristics of the light irradiated by the illumination device; and
a mechanical connector electrically connecting with the hardware controller.

* * * * *